(12) United States Patent
Mizumura et al.

(10) Patent No.: US 7,396,481 B2
(45) Date of Patent: *Jul. 8, 2008

(54) ETCHING METHOD OF ORGANIC INSULATING FILM

(75) Inventors: Michinobu Mizumura, Yokohama (JP); Ryooji Fukuyama, Kudamatsu (JP); Yutaka Ohmoto, Hikari (JP); Katsuya Watanabe, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 332 days.

This patent is subject to a terminal disclaimer.

(21) Appl. No.: 11/208,592

(22) Filed: Aug. 23, 2005

(65) Prior Publication Data
US 2006/0065624 A1 Mar. 30, 2006

Related U.S. Application Data

(63) Continuation of application No. 10/814,249, filed on Apr. 1, 2004, now Pat. No. 7,014,787, which is a continuation of application No. 10/080,540, filed on Feb. 25, 2002, now Pat. No. 6,793,833.

(30) Foreign Application Priority Data
Sep. 20, 2001 (JP) .............................. 2001-286052

(51) Int. Cl.
H01L 21/00 (2006.01)
G01L 21/30 (2006.01)
(52) U.S. Cl. ............................. 216/59; 216/60; 216/67; 438/706; 438/710; 438/725

(58) Field of Classification Search ................... 216/59, 216/61, 67, 60; 438/706, 710, 725
See application file for complete search history.

(56) References Cited

U.S. PATENT DOCUMENTS

| 6,080,529 | A | 6/2000 | Ye |
| 6,548,416 | B2 | 4/2003 | Han |
| 6,617,244 | B2 | 9/2003 | Nishizawa |

FOREIGN PATENT DOCUMENTS

| JP | 08 330278 | 12/1996 |
| JP | 9-186134 | 7/1997 |
| JP | 10-335308 | 12/1998 |
| JP | 2000-252359 | 9/2000 |
| JP | 0115213 | 1/2001 |
| JP | 2001-176853 | 6/2001 |
| JP | 2001-335932 | 12/2001 |
| JP | 2001-338909 | 12/2001 |

*Primary Examiner*—Shamim Ahmed
(74) *Attorney, Agent, or Firm*—Antonelli, Terry, Stout & Kraus, LLP.

(57) ABSTRACT

This invention relates to a method for etching an organic insulating film used in the production of semiconductor devices. A sample to be etched on which a low dielectric constant organic insulating film is formed is etched by generating a plasma from hydrogen gas and nitrogen gas or ammonia gas, and controlling the gas flow rate and pressure so that the light emission spectral intensity ratio of hydrogen atom and cyan molecule in the plasma comes to a prescribed value. By this method, a low dielectric constant organic insulating film as an insulating film between layers can be etched without using any etch stop layer so that bottom surfaces of trenches and holes for electrical wiring become flat.

12 Claims, 8 Drawing Sheets

(a)

(b)

(c)

(d)

(e)

(f)

ETCHING METHOD OF ORGANIC INSULATING FILM

CROSS-REFERENCE TO RELATED APPLICATION

This application is a continuation application of U.S. application Ser. No. 10/814,249, filed Apr. 1, 2004, now U.S. Pat. No. 7,014,787, which is a continuation application of U.S. application Ser. No. 10/080,540, filed Feb. 25, 2002, now U.S. Pat. No. 6,793,833, the contents of which are incorporated herein by reference.

BACKGROUND OF THE INVENTION

1. Field of the Invention

This invention relates to an etching method of organic insulating films, and particularly to an etching method suitable for etching organic insulating films used in the production of semiconductor devices.

2. Description of the Related Art

[Prior Art 1]

As a method for etching an organic insulating film while preventing the microtrenching without using etch stop layer, for example, the method of WO 01/15213 A1 (JP-A-2001-60582) is known. The gazette of the above-mentioned patent gives the following description.

Thus, the wafer temperature is maintained at 20-60° C., in accordance with the processing. Then, a gaseous mixture of $N_2$, $H_2$ and Ar is introduced into the processing chamber. The inner pressure of the processing chamber is adjusted to 500 mTorr or more substantially, and preferably 500-800 mTorr substantially. Then, a radio-frequency voltage having a frequency of 13.56 MHz and a power of 600-1,400 W is applied to the lower electrode, and a radio-frequency power having a frequency of 60 MHz and a power of 600-1,400 W is applied to the upper electrode. By taking such a measure, a high-density plasma is generated in the processing chamber and, due to the plasma, contact holes of a desired shape are formed in the insulating layer between layers of wafer made of an organic low-dielectric constant material.

Further, the same gazette as above makes the following mention, too.

A treating gas containing at least a nitrogen atom-containing gas and a hydrogen atom-containing gas is introduced into the processing chamber, and the inner pressure of the vacuum processing chamber is adjusted substantially to 500 mTorr or more to carry out etching of the organic layer film formed on the wafer to be etched placed in the processing chamber. As the material constituting the organic film, a low-dielectric constant material having a relative permittivity of 3.5 or less is preferable. The inner pressure of the vacuum processing chamber is preferably kept at 500-800 mTorr substantially.

By using a gas containing at least a nitrogen atom-containing gas and a hydrogen atom-containing gas as the processing gas and adjusting the inner pressure of the vacuum processing chamber substantially to 500 mTorr or higher, microtrenching can be prevented without using etch stop layer and the mask-selection ratio can be enhanced. Such a technique is especially effective for processes which require to stop the etching in the midst of an organic layer film, such as the dual damascene process, or the like.

It is possible to use $N_2$ as the nitrogen atom-containing gas or to use $H_2$ as the hydrogen atom-containing gas, if desired. In the gazette referred to above, there are mentioned some examples in which the $N_2/H_2$ flow rate ratio ($N_2/H_2$) is 400 sccm/400 sccm, 200 sccm/200 sccm, and 100 sccm/300 sccm.

[Prior Art 2]

As another method for etching an organic insulating film, the method of JP-A-2000-252359 is known. The following description is given in the gazette thereof.

An insulating film (insulating film) between layers made of an organic dielectric film such as polyallyl ether is subjected to etching, while forming a CN group-containing reaction product, etc. by the use of an NH group-containing ion or radical generated from a gas plasma made from a mixture of hydrogen and nitrogen or an ammonia-containing gas.

The etching process of the insulating film between layers is carried out by means of ECR type (Electron Cyclotron Resonance type) plasma etching apparatus under conditions of, for example, a substrate-provided electrode temperature of 20° C., a μ-wave power (2.45 GHz) of 2,000 W, a pressure of 0.8 Pa, an RF power of 300 W, by using $NH_3$ as an etching gas at a flow rate of 100 sccm.

In the etching process mentioned above, it is also possible, if desired, to carry out the etching process by the use of a gas plasma comprising a gaseous mixture of hydrogen and nitrogen at a flow rate ($N_2+H_2$) of, for example, 100 sccm at a $H_2/N_2$ flow rate ratio of, for example, 75/25 sccm.

By carrying out the etching using NH group-containing ion or radical, an insulating film containing an organic dielectric film can be subjected to an anisotropic etching without forming a damage layer causing defective conduction, while suppressing side etching, while maintaining a high etch rate of about 450 nm/minute, without bringing about a reduction of throughput, and rapidly.

By such a technique, it is also possible to etch an insulating film containing an organic insulating film to open contact holes. This technique is applicable also to an etching process for forming trench for interconnect wiring such as damascene process, or to an etching process for simultaneously opening trench for interconnect wiring and contact hole such as dual damascene process, etc.

Further, if etching process of insulating film between layers is carried out under various conditions [(a) $N_2$=100 sccm, (b) $N_2/H_2$=50/50 sccm and (c) $H_2$=100 sccm] and emission spectra are measured, an NH peak observable neither in the case (a) using $N_2$ gas nor in the case (c) using $H_2$ gas is observed in the case (b) using $N_2/H_2$ mixture. Further, as for CN peak, the peak intensity observed in the case (b) using $N_2/H_2$ mixture is higher than the peak intensity in the case (a) using $N_2$ gas and in the case (c) using $H_2$ gas.

Further, if the flow rate ratio of etching gas is so varied that $N_2/H_2$=100/0 to 50/50 to 0/100 sccm and the relative etch rate (the etch rate at $N_2/H_2$=100/0 sccm is taken as 1) and the emission spectral intensity ratios between the light-emitting components (CN, NH, $N_2$, CH, H) at varied flow rate ratios are measured, it is found that the etch rate and the emission spectral intensity ratio between CN and NH are roughly the same in the behavior.

SUMMARY OF THE INVENTION

In the recent years, a damascene process using copper has been used as a method for forming a wiring on semiconductor elements. As an application of the damascene process, a dual damascene process can be referred to. In the prior dual damascene, an etch stop layer has been used for preventing the sub-trenching which is sometimes called "microtrenching", at the time of forming a trench for interconnect wiring leading to the organic insulating film functioning as an insulating film between layers. Since an etch stop layer has a high dielectric constant, however, it is attempted today to lower the dielectric constant without using any etch stop layer.

According to the former prior art mentioned above (JP-A-2001-60582), etching of organic layer film is performed while keeping the inner pressure of vacuum processing chamber at 500 mTorr (ca. 66.5 Pa) or above, and preferably at 500-800 mTorr. According to this etching method, however, inner pressure of the processing chamber is very high, and hence this method is expected to have the following problems: (1) in the case of samples having a large diameter such as 300 millimeter wafer, the waste gas generated as a reaction product from the wafer surface cannot sufficiently be removed at the central part of wafer, so that the etch rate within the wafer surface is not uniform, (2) the quantity of reaction product is so large that controlling the shape of trench and hole is difficult, and (3) the quantity of reaction product is so large that inside of processing chamber is apt to be soiled, which reduces reproducibility of the etching treatment. Accordingly, a measure for solving these problems have to be taken when the processing is to be carried out at a high processing pressure.

On the other hand, the latter prior method (JP-A-2000-252359) is known as a method for etching an organic insulating film at a low processing pressure (0.8 Pa) which makes it unnecessary to consider the above-mentioned problems in the etching process at a high processing pressure. The latter prior method, however, pays no consideration for the problem occurring When an organic insulating film of dual damascene process is etched while preventing microtrenching without using etch stop layer.

According to the latter prior art, an organic insulating film is etched with an NH group-containing ion or radical generated by gas discharge or the like in a hydrogen-nitrogen gas mixture or ammonia gas mixture as a processing gas, while forming a CN group-containing reaction product, etc. However, this technique is unable to prevent the microtrenching without using etch stop layer at any flow rate ratio of hydrogen-nitrogen mixed gas or ammonia-containing gas.

The etching method of the latter prior art is a method in which attention is paid to the fact that etch rate and CN/NH emission spectral ratio are roughly the same in behavior. Accordingly, this method has a problem that the optimum condition of etching cannot be selected on the basis of CN/NH emission spectral intensity ratio, and the optimum condition for etching an organic insulating film while preventing microtrenching without using etch stop layer cannot be selected.

The phenomenon that a microtrenching (sometimes called "sub-trenching", too) is formed and thereby the bottom surface of the trenches or holes of the etched part become impossible to flatten is attributable to the following fact. The etch rate is higher in the neighborhood of sidewall of trenches and holes than in the central parts of the trenches and holes due to collision of the incident ion originated from the plasma against the sidewall, caused by the slight taper of the sidewall of trenches and holes which are the part to be etched, followed by concentration of the incident ion into the neighborhood of sidewall of trenches and holes, or due to a re-deposition of various reaction products formed by the etching to the central parts of trenches and holes.

It is an object of this invention to solve the problems mentioned above by providing an etching method of organic insulating film which makes it possible to perform etching of an organic insulating film while suppressing the re-deposition of reaction products onto inner walls of processing chamber and preventing the microtrenching.

The above-mentioned object can be achieved by an etching method of organic insulating film which comprises generating a plasma from a molecular gas containing hydrogen atom and nitrogen atom, measuring the emission spectral intensity ratio between hydrogen atom and cyan molecule in the plasma, and carrying out the processing while keeping the measured value of the ratio at a prescribed value or under.

In this invention, there is used a plasma in which the emission spectral intensity ratio CN/H between the emission spectrum of hydrogen (H) at a wavelength of about 486 nm and that of cyan molecule (CN) at a wavelength of about 388 nm is 1 or less.

Further, the above-mentioned object can be achieved by generating a plasma from hydrogen gas and nitrogen gas or ammonia gas, and performing an etching method of organic insulating film while controlling the flow rate of hydrogen gas so that the emission spectral intensity ratio between hydrogen atom and cyan molecule in the plasma comes to a prescribed value or under.

The processing is carried out while controlling the processing pressure at a constant value.

Further, the above-mentioned object can be achieved by supplying a nitrogen gas and a hydrogen gas or a molecular gas containing hydrogen atom and nitrogen atom into an etching process chamber in which is placed a sample to be etched forming an organic insulating film, adjusting the inner pressure of the etching process chamber to a pressure lower than 10 Pa, thereby generating a plasma in which the intensity ratio CN/H between an emission spectrum of hydrogen atom (H) at a wavelength of about 486 nm and an emission spectrum of cyan molecule (CN) at a wavelength of 388 nm is 1 or less, and processing the sample to be etched with said plasma.

For generating of the plasma, a hydrogen gas and a nitrogen gas are used, and the mixing ratio of the hydrogen gas to the nitrogen gas is adjusted to 10 or more. Further, total flow rate of the hydrogen gas and nitrogen gas is adjusted to 200 cc/minute or more.

Alternatively, a hydrogen gas is used as the molecular gas containing hydrogen atom, an ammonia gas is used as the molecular gas containing nitrogen atom, and the mixing ratio of the hydrogen gas to the ammonia gas is adjusted to 10 or more. Further, the total flow rate of the hydrogen gas and the ammonia gas is adjusted to 200 cc/minute or more.

According to another embodiment of this invention, the above-mentioned object can be achieved by generating a plasma in the process chamber, measuring the emission spectral intensity ratio between cyan molecule and hydrogen atom in the plasma, controlling the flow rate-controlling valves so as to keep the measured value at a prescribed value or under, and etching the sample to be etched, by the use of an apparatus equipped with a sample stand on which a sample to be etched can be placed, an air-leakless process chamber into which an etching gas is fed, a vacuum pump evacuating the inner space of process chamber to a reduced pressure, flow rate-controlling valves which can control the flow rates of hydrogen gas and nitrogen gas or a molecular gas containing hydrogen atom and nitrogen atom, a gas exhaust rate-controlling valve which is placed between the vacuum pump and the process chamber to control the exhaust rate of the etching gas fed into the process chamber, a circuit and an electric source to which the electric power for generating a plasma from the etching gas in the process chamber can be applied, and a vacuum gauge for measuring the pressure in the process chamber. The flow rate-controlling valves are controlled so as to increase the flow rate of hydrogen gas. Further, the gas exhaust rate-controlling valve is controlled so as to keep constant the inner pressure of the process chamber.

The sample to be etched is etched while controlling the output of electric source for generating a plasma from the etching gas so as to keep the measured value at a prescribed value or under. The electric source is controlled so as to increase the output and thereby to increase generation of hydrogen atom in the plasma.

Further, an electric source capable of inputting a bias voltage to the sample to be etched is connected to the sample stand, and the electric source is controlled so as to lower the bias voltage and thereby keep the measured value at a prescribed value or under.

Other objects, features and advantages of the invention will become apparent from the following description of the embodiments of the invention taken in conjunction with the accompanying drawings.

DETAILED DESCRIPTION OF THE EMBODIMENTS

Hereunder, one example of this invention is explained by referring to FIGS. 1 to 10.

Figure 1:
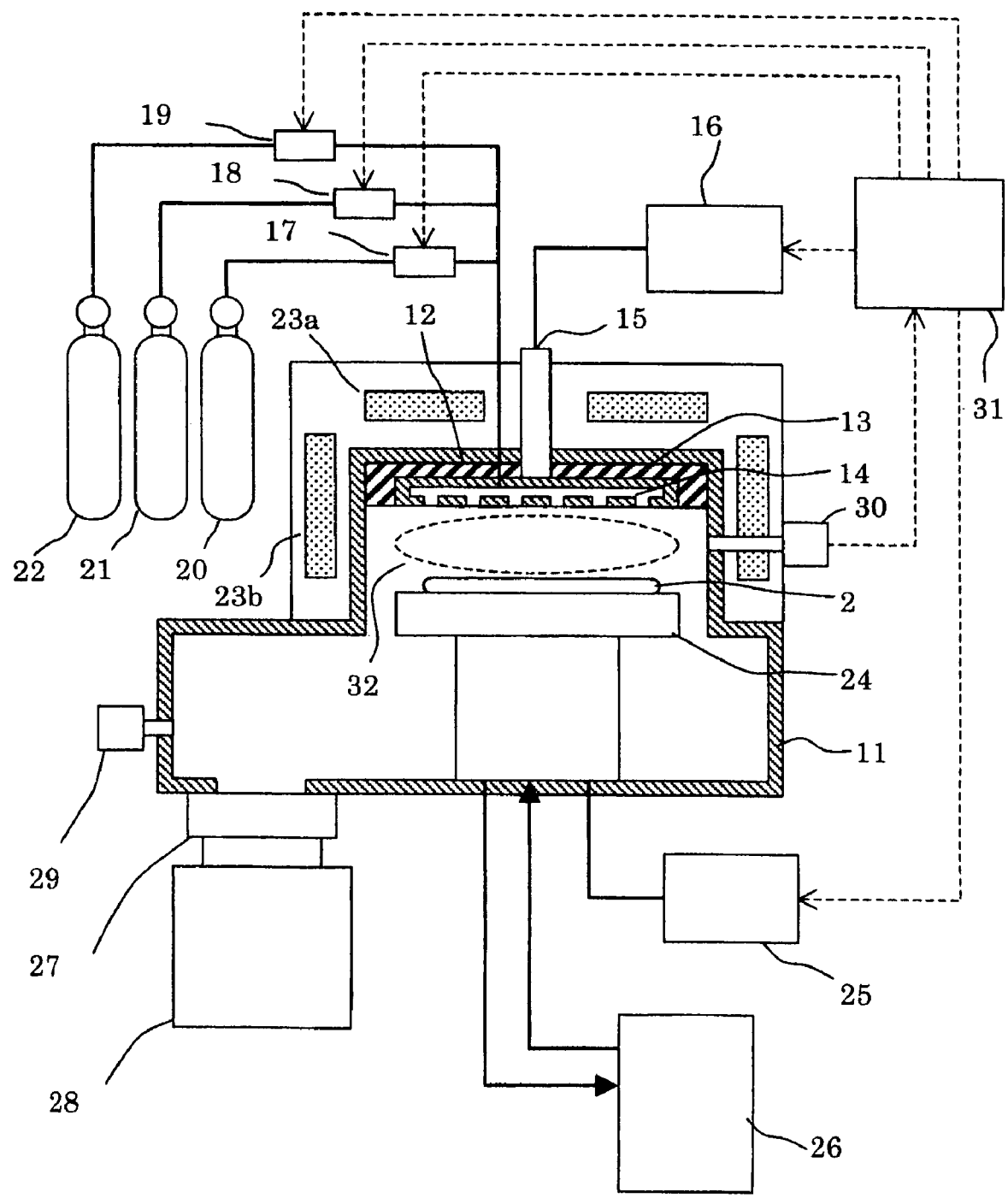
FIG. 1 is a longitudinal cross sectional view illustrating one example of the etching apparatus for carrying out the etching method of this invention.
Figure 2:
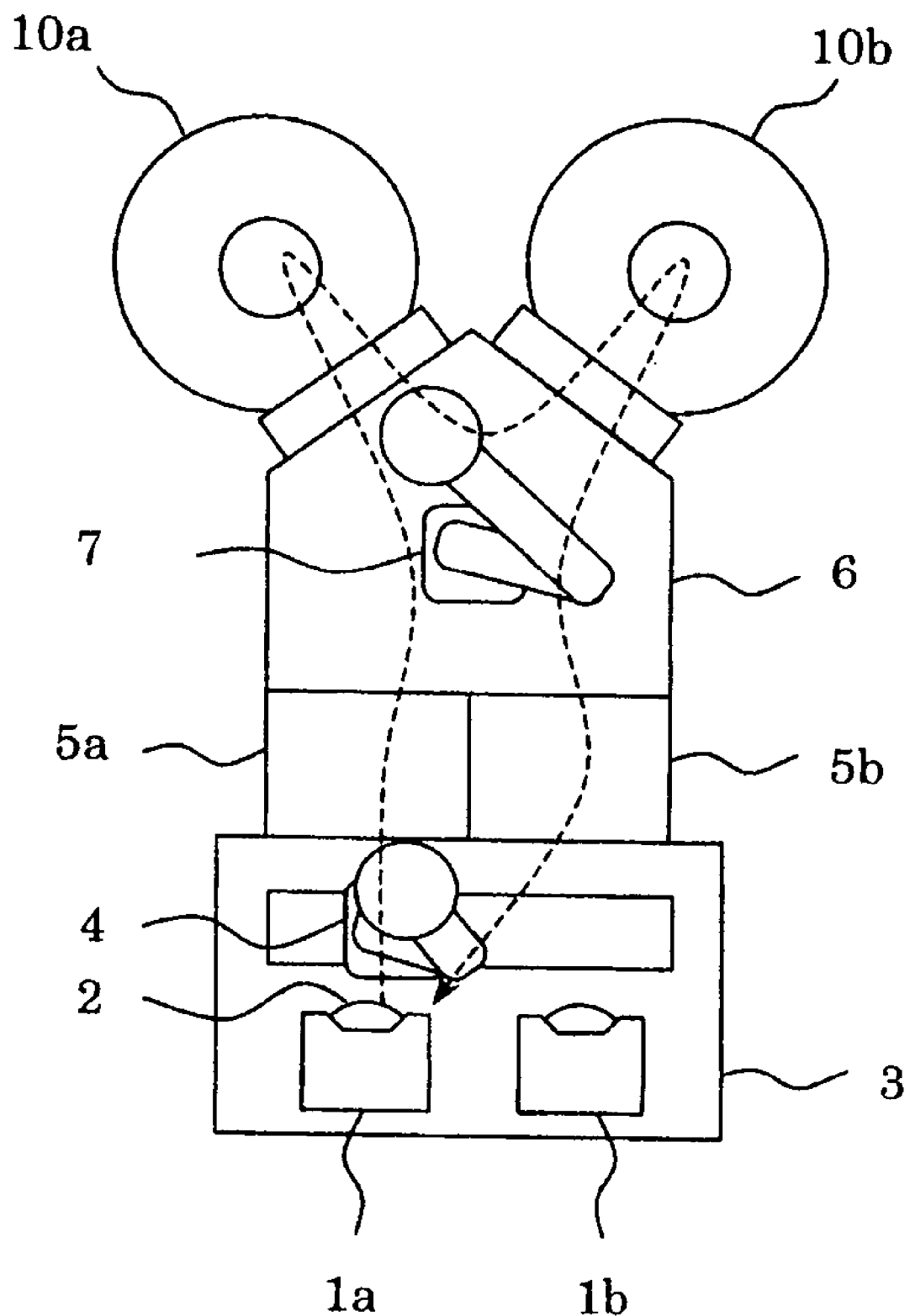
FIG. 2 is a plan view illustrating the whole of the plasma etching apparatus provided with the etching apparatus of FIG. 1.

FIGS. 1 and 2 illustrate one example of the plasma etching apparatus for carrying out the etching method of this invention, wherein FIG. 1 illustrates an outlined construction of the etching process chamber, and FIG. 2 illustrate the whole of the plasma etching apparatus provided with the etching process chamber of FIG. 1.

In the vacuum chamber 11, a sample stage 24 is provided, on which wafer 2, namely a sample to be etched, can be set.

The sample stage 24 is connected to a high-frequency electric source 25 (for example, frequency 800 kHz) for bias voltage which gives a bias voltage to wafer 2. Sample 24 is connected also to a temperature controlling apparatus 26 for controlling the temperature of wafer 2.

In the upper part of the vacuum container 11 is formed a cylindrical process chamber. Outside the process chamber of the vacuum chamber 11 is provided magnetic field-generating coils 23a and 23b so as to envelop the process chamber. In the upper part of the process chamber in the vacuum chamber 11 is provided a plate antenna 13 composed of an electroconductive material so as to confront the sample stage 24 through intermediation of a dielectric body 12 through which an electromagnetic field can propagate. In the upper part of the plate antenna 13 is provided a coaxial line 15, via which the antenna is connected to a high-frequency electric source 16 (for example, frequency 450 MHz) for generating a plasma.

On the plate antenna 13 is formed a gas feeding line 14 having a through-holes for supplying an etching gas into the process chamber. The to gas feeding line 14 is connected to gas tanks 20, 21 and 22 via flow rate controlling valves 17, 18 and 19, respectively.

In the bottom part of the vacuum chamber 11 is provided a vacuum gas exhaust hole, which is connected to vacuum pump 28 via gas exhaust rate controlling valve 27.

In the process chamber part of the vacuum chamber 11, there is provided a spectro-photoelectric converter 30, which detects the light emitted from the plasma 32 formed between the plate antenna 13 and sample stage 24 and converts a light of specified wavelength to electric signals. The electric signals emitted from the spectro-photoelectric converter 30 is input to controller 31. The controller 31 carries out a calculation mentioned later, and outputs the electric signals for controlling the flow rate controlling valves 17, 18 and 19 and the high-frequency electric sources 16 and 25. The vacuum chamber 11 is provided with vacuum gauge 29. Although not shown in the figures, the detected signals are input to the controller 31, and the controller 31 controls the gas exhaust rate controlling valve 27.

The etching process chamber having the construction of FIG. 1 is set around the vacuum carrying chamber 6 as shown in FIG. 2, as etching process chambers 10a and 10b. Around the vacuum carrying chamber 6 are provided load lock chamber 5a and unload lock chamber 5b. The load lock chamber 5a and unload lock chamber 5b are connected to atmospheric air unit 3. The atmospheric air unit 3 is provided with atmospheric air carrying robot 4, and wafer 2 is carried by the air carrying robot 4 between cassette 1a or 1b and load lock chamber 5a or unload lock chamber 5b. The vacuum carrying chamber 6 is provided with a vacuum carrying robot 7, and wafer 2 is carried by the vacuum carrying robot 7 between the load lock chamber 5a or unload lock chamber 5b and etching process chamber 10a or 10b.

In the apparatus having the above-mentioned construction, wafer 2 is carried from the cassette 1a, for example, into etching process chamber 10a as shown at FIG. 2. After carrying the wafer 2, the wafer 2 is held on the sample stage 24, and set to a position of prescribed height by the stage which can move upward and downward. The wafer 2 is maintained at a prescribed temperature by a sample temperature control equipment. After reducing the inner pressure of vacuum chamber 11 by the use of vacuum pump 28, the flow rate controlling valves 17, 18 and 19 are controlled to introduce the process gas (etching gas in this case) into the process chamber from the gas feeding sources 20, 21 and 22 via the gas feeding line 14, and adjusted to a desired pressure. After adjustment of pressure in the process chamber, a high-frequency power (a high-frequency power of 450 MHz, for example) is oscillated from high-frequency electric source 16. The high-frequency power oscillated from the high-frequency electric source 16 propagates through the coaxial line 15 and is introduced into the process chamber via plate antenna 13 and dielectric body 12. The electric field of the high-frequency electric power introduced into the process chamber generates a plasma 32 at a low pressure in the process chamber, through interaction with the magnetic field formed in the process chamber by the magnetic field-generating coils 23a and 23b, such as solenoid coils. When a magnetic field having a strength capable of inducing an electron cyclotron resonance effect (for example, 160 G) is formed in the process chamber, a plasma can be generated especially efficiently. Simultaneously with generation of plasma, a high-frequency power having a frequency of, for example, 800 KHz, is input to the sample stage 24 by the high-frequency electric source 25. By this, an incident energy into wafer 2 is given to the ion in plasma 32, the ion enters the wafer 2, and an anisotropic etching of wafer 2 is promoted.

Figure 3:
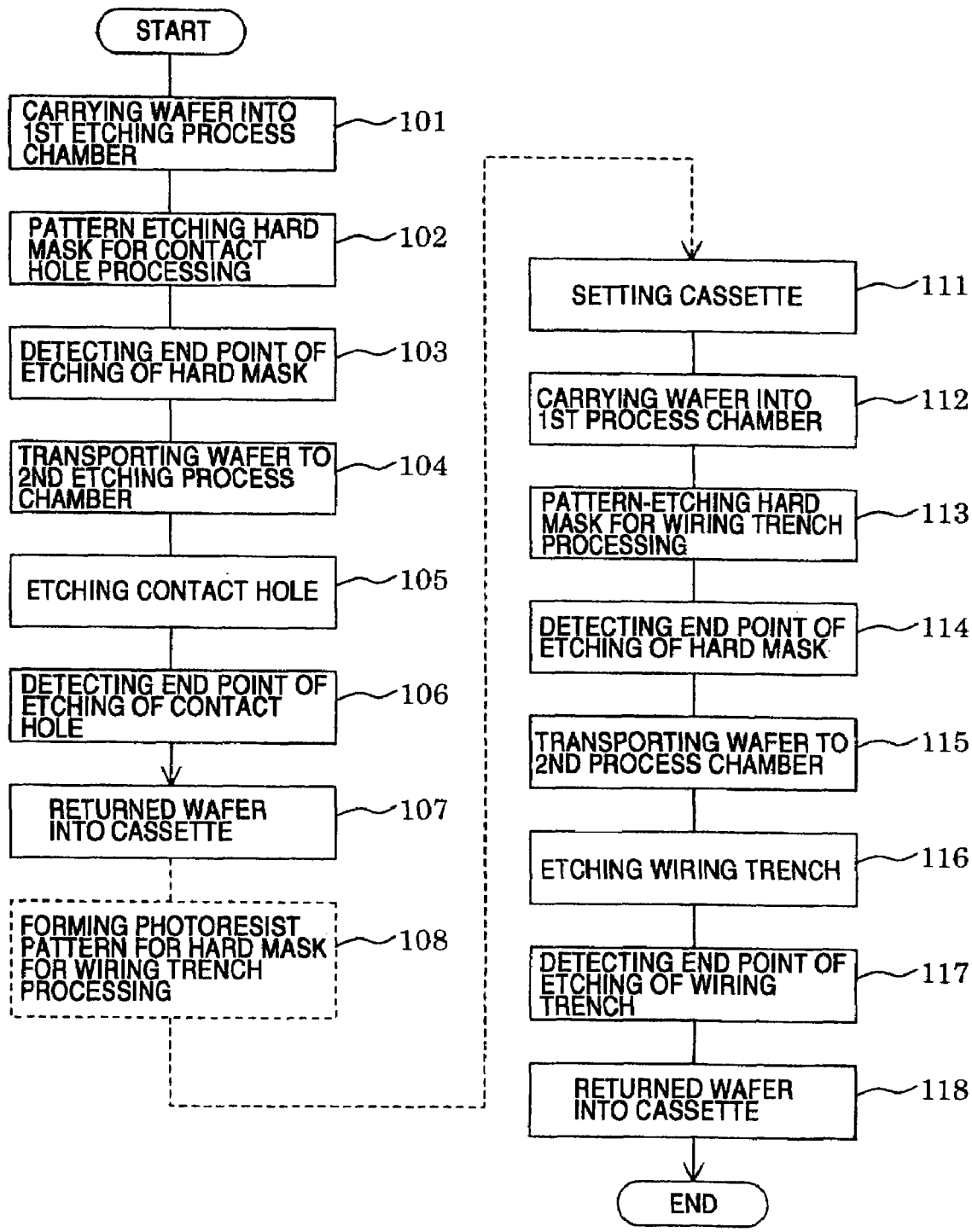
FIG. 3 is a flow chart illustrating an etching process using the apparatus of FIG. 2.
Figure 4:
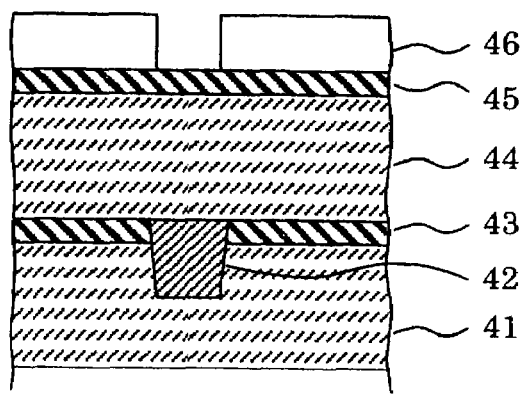
FIGS. 4(a)-4(f) are longitudinal cross sectional views illustrating the shape of cross section of etching of a wafer according to the etching flow shown in FIG. 3.
Figure 4:
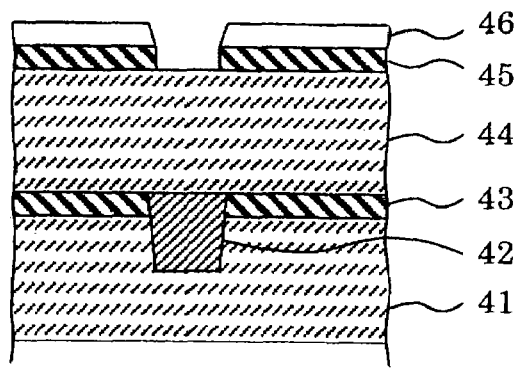
Figure 4:
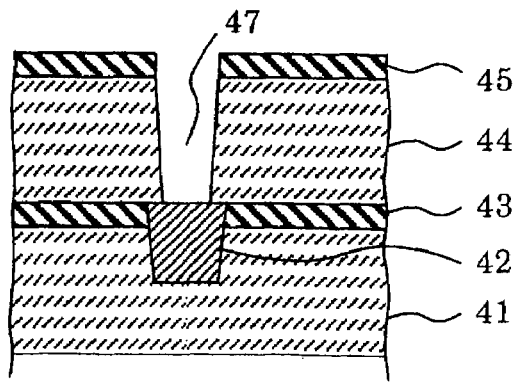
Figure 4:
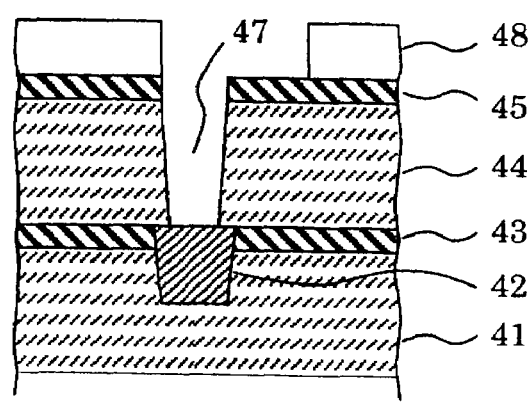
Figure 4:
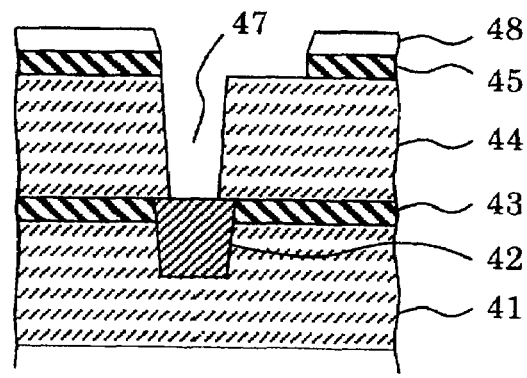
Figure 4:
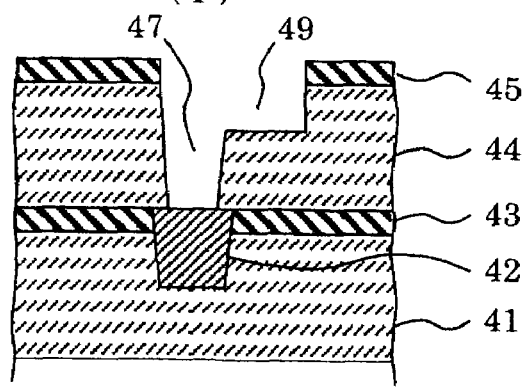

Next, an etching process of insulating film between layers to composed of an organic insulating film used in the dual damascene process using the above-mentioned apparatus will be explained by referring to FIGS. 3 and 4.

First, an unprocessed wafer 2 is carried into the first etching process chamber 10a (Step 101). At this time, the unprocessed wafer 2 is in a state that, as shown in FIG. 4(a), a patterned photoresist is formed on an unprocessed hard mask 45. The wafer 2 is in a state that a multilayer interconnect wiring is formed on a substrate, provided that in this case the underlayer organic insulating film 41 (insulating film between layers), underlayer interconnect wiring 42 and underlayer hard mask layer 43 have already been processed. On the underlayer hard mask 43, an organic insulating film 44 which is an interlayer insulating film to be processes from now (an organic film having a low dielectric constant of 2.6-2.7, such as SiLK™ manufactured by Dow Chemicals) and a hard mask 45 (in this case, a dual hard mask made of SiN film/SiO$_2$ film) are formed in the form of films. As an uppermost layer, a patterned photoresist 46 is formed.

Next, a process gas for hard mask etching (for example, Ar+O$_2$+CF gas (C$_5$F$_8$)) is fed into the process chamber of the first etching process chamber 10a, and a plasma etching is carried out. In this etching process, a mask for processing the connection holes for etching the organic insulating film 44 is formed (Step 102).

In the etching process of hard mask 45, the completion of etching is detected by the end point detection using emission spectroscopic analysis (Step 103). FIG. 4(b) illustrates a cross section of processing of the etched material. At this point in time, photoresist 46 may remain.

Next, wafer 2 which has completed the processing of hard mask 45 is carried to the second etching chamber 10b (Step 104).

In the second etching process chamber 10b, a process gas for etching of organic insulating film (ammonia NH$_3$) is fed into the process chamber to perform a plasma etching. In this etching process, contact holes with underlayer interconnect wiring 42 are formed on the organic insulating film 44 (Step 105). The photoresist remaining from the preceding step is composed of fundamentally identical components with the organic insulating film, and hence it is also etched off in the etching process of this step.

In the etching process of organic insulating film 44, the completion of etching is detected by the end point detection using emission spectroscopic analysis (Step 106). FIG. 4(c) illustrates the cross section of processing of the etched material. At this time, photoresist 46 has been removed, so that the connection hole 47 reaches the underlayer interconnect wiring 42.

The wafer 2 which has completed the etching processing of organic insulating film 44 is returned into the original cassette 1a (Step 107).

When all the wafers 2 in the cassette 1a have been processed and returned into cassette 1a as above, a preparation for processing the interconnect wiring trench on the organic insulating film 44 is started. Cassette 1a containing the wafers 2 which have completed the processing of contact hole 47 are sent to other apparatus, such as washing apparatus, resist-coating apparatus, light-exposing apparatus, developing apparatus, etc.

By these apparatuses, a photoresist in which a pattern of wiring trench is patterned on hard mask 45 is formed on wafer 2 in the cassette 1a (Step 108).

Subsequently, cassette 1a containing the wafer 2 having the patterned photoresist thereon is set to the atmospheric air unit 3 of the plasma etching apparatus (Step 111).

After setting the cassette 1a, wafer 2 is carried into the first etching process chamber 10a (Step 112). At this time, the wafer 2 has a patterned photoresist 48 formed on hard mask 45, as shown in FIG. 4(d).

Subsequently, the same process gas for hard mask etching as in Step 102 (for example, Ar+O$_2$+CF gas (C$_5$F$_8$)) is fed into the process chamber of the first etching process chamber 10a to carry out a plasma etching. In this etching treatment, a mask for processing of wiring trench for etching the organic insulating film 44 is formed (Step 113).

Completion of the etching processing of hard mask 45 is detected by the end point detection by emission spectroscopic analysis (Step 114). FIG. 4(e) shows the cross section of processing of the etched body. In hard mask 45, openings for wiring trenches of which opening diameter is greater than that of contact hole 47 are formed. At this point in time, photoresist 46 may remain.

Subsequently, the wafer 2 which has completed the processing of hard mask 45 is carried into the second etching process chamber 10b (Step 115).

A process gas for the etching treatment of organic insulating film (hydrogen gas (H$_2$)+nitrogen gas (N$_2$)) is fed into the process chamber of the second etching process chamber 10b to carry out a plasma etching. By this etching process, a wiring trench having a prescribed depth is formed in the organic insulating film 44 (Step 116). Since this etching process uses no etching stopper layer, flattening of the etching bottom surface is important and, at the same time, uniformity of etch depth within the wafer is important. The conditions of process and the method for controlling the process in this etching process will be mentioned later. The photoresist 48 remaining from the preceding step is etched off altogether in the etching process of this step, in the same manner as above.

Completion of the etching processing of organic insulating film 44 is detected by an end point detecting method such as mentioned in U.S. patent application Ser. No. 09/946504 (JP Application 2001-28098) which comprises using a wavelength pattern of differentiated value of interference light, measuring the film thickness from the standard pattern and the actual pattern at the time of actual processing and calculating the depth of etching (Step 117). FIG. 4(f) illustrates the cross section of processing of the etched body. At this point in time, photoresist 46 has been removed, and wiring trench 49 having a prescribed depth is formed.

The wafer 2 which has completed the etching processing of organic insulating film 44 is returned into the original cassette 1a (Step 118).

By carrying out the steps mentioned above, a processing of organic insulating film according to dual damascene process can be put into practice. With the plasma etching apparatus of the present example, two etching process chambers can be used, and therefore the etching of hard mask 45 for processing of contact hole and the etching of organic insulating film 44 can be carried out continuously. Further, the etching of hard mask 45 for processing of wiring trench and the etching of organic insulating film 44 can be carried out continuously by merely changing over the process gas of the second etching process chamber. Thus, a processing of organic, insulating film according to dual damascene process can be performed with only one apparatus.

Further, if three etching process chambers are provided around the vacuum carrying chamber 6 so as to carry out the etching of hard mask 45 for contact holes and wiring trenches at the second process chamber placed at the central position, the etching of the contact holes of the organic insulating film 44 at the first etching process chamber placed in the neighborhood (for example, on the left side) of the second etching process chamber, and the etching of the wiring trenches of organic insulating film 44 at the third etching process chamber placed in the neighborhood (for example, on the right side) of the second etching process chamber, the processes of the respective etching process chambers can be fixed. Further, it is also possible to use the second and first etching process chambers alternately to carry out a continuous process with the second and first etching process chambers or with the second and third etching process chambers. By taking such a measure, it becomes possible to store the wafers for contact holes in cassette 1a and the wafers for wiring trenches in cassette 1b and thereby to carry out the etching of the contact holes and wiring trenches simultaneously with only one apparatus (simultaneous processing).

Further, if four etching process chambers are provided around the vacuum carrying chamber 6, the etching of the hard mask 45 for contact holes and etching of the contact holes of organic insulating film 44 can be carried out continuously at respective process chambers for exclusive use, by the use of the first and second etching process chambers; and the etching of the hard mask 45 for wiring trenches and etching of the wiring trenches of organic insulating film 44 can be carried out continuously at respective process chambers for exclusive use, by the use of the third and fourth etching process chambers. By taking such a measure, it becomes possible to store the wafers for contact holes in cassette 1a and the wafers for wiring trenches in cassette 1b and thereby to carry out the etching of the contact holes and wiring trenches in parallel with only one apparatus.

In the present example, the load rock chamber 5a is distinguished from unload rock chamber 5b. However, it is also possible to use the rock chamber 5a for carrying in and carrying out the wafers of cassette 1a and to use the rock chamber 5b for carrying in and carrying out the wafers of cassette 1b. By taking such a measured, the carrying route of wafers can be made shortest in the above-mentioned simultaneous and in-parallel processes in the cases of providing three or four etching process chambers.

Subsequently, the etching method of wiring trenches of organic insulating film 44 in the above-mentioned Step 116 will be explained by referring to FIGS. 5 to 10.

In the etching of wiring trench, the etching characteristics were evaluated for the five cases shown in Table 1.

TABLE 1

| Case | Gas flow rate (cc/min) | | | Inner pressure of process chamber (Pa) | Etch rate (nm/min) | CN/H intensity ratio | Sub-trench coefficient |
|---|---|---|---|---|---|---|---|
| | Hydrogen gas | Nitrogen gas | Ammonia gas | | | | |
| 1 | 200 | 10 | 0 | 3 | 122 | 0.6 | 96 |
| 2 | 200 | 0 | 20 | 3 | 154 | 0.7 | 100 |
| 3 | 50 | 50 | 0 | 3 | 159 | 4.5 | 122 |
| 4 | 50 | 0 | 50 | 3 | 189 | 6 | 126 |
| 5 | 200 | 10 | 0 | 10 | 127 | 3.7 | 120 |

In Cases 1 to 4, the process pressure was adjusted to a pressure lower than 10 Pa (3 Pa in these cases), and species and flow rate of gas were varied. In Cases 1 and 3, nitrogen gas was used as the etching gas for organic insulating film and a mixture of hydrogen gas ($H_2$) and nitrogen gas ($N_2$) was used. In Cases 2 and 4, ammonia gas was used as an etching gas for organic insulating film, and a mixture of hydrogen gas ($H_2$) and ammonia gas ($NH_3$) was used. In Case 1, the quantity of hydrogen gas was 20 times that of nitrogen gas functioning as etchant for organic insulating film. In Case 2, the quantity of hydrogen gas was 10 times that of ammonia gas functioning as etchant for organic insulating film. In Case 3, the quantity of hydrogen gas was the same as that of nitrogen gas functioning as etchant for organic insulating film. In Case 4, the quantity of hydrogen gas was the same as that of ammonia gas functioning as etchant for organic insulating film. In Case 5, the same process gas as in Case 1 was used, and the process pressure was 10 Pa or more (10 Pa in this case). Throughout all the cases, the power of high-frequency power for plasma generation was 1 kW.

These experimental results demonstrate the following facts:

(1) Etch rate can be improved by using ammonia gas as etching gas, as compared with the other case.

(2) Sub-trenching coefficient can be improved by increasing the proportion of hydrogen gas as compared with that of etchant gas. The term "sub-trenching coefficient" means the following ratio expressed in term of percentage: (Etch rate in areas near the etched sidewall/Etch rate at center of trench)

When the percentage defined above is 100% or less, it is known that no sub-trenching has occurred.

(3) For preventing the sub-trenching, it is necessary that the mixing ratio of the H-component gas to the N-component gas (H-gas/N-gas) in the treating gas is 10 or more, the total flow rate is 200 cc/minute or more, and the emission spectral intensity ratio (CN/H) is 1 or less. These conditions further mean that, in order to prevent the sub-trenching, the pressure in the etching process chamber has to be lower than 10 Pa.

By measuring the emission spectral intensity of the plasma in the cases inducing no sub-trenching and the cases inducing sub-trenching, it has been found that characteristic peaks of light emission intensity appear at wavelengths of 388 nm and 486 nm. These two spectra are assignable to cyan molecule (CN) having a wavelength of 388 nm and hydrogen atom (H) having a wavelength of 486 nm.

Figure 5:
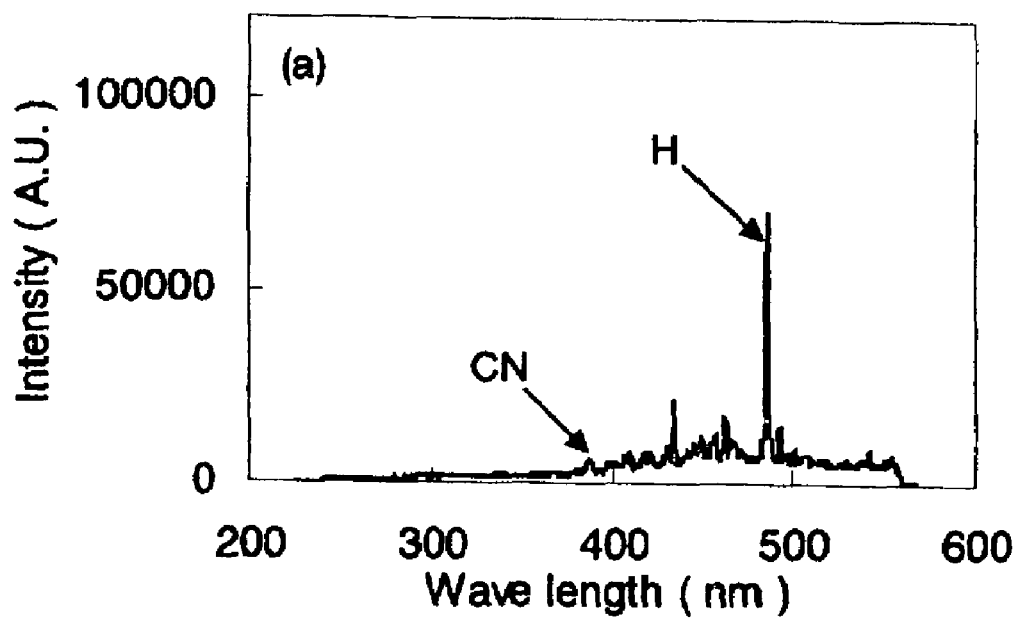
FIG. 5 is a figure illustrating the light emission intensity of a plasma in the subtrench-free etching process in an interconnect wiring trench processing of an organic insulating film.

As a result, it can be concluded that the etching conditions inducing no sub-trenching are those of Case 1 and Case 2. FIG. 5 illustrates result of measurement of light emission intensities of cyan molecule (CN) which is reaction product in the plasma formed under the subtrenching-free conditions and hydrogen atom (H), wherein it is known that hydrogen atom (H) is-higher than cyan molecule (CN) in light emission intensity. The etching conditions in this case are as follows; $H_2$: 300 sccm, $N_2$: 10 sccm, pressure of treatment: 3 Pa, high-frequency power for formation of plasma: 1 kW.

Figure 7:
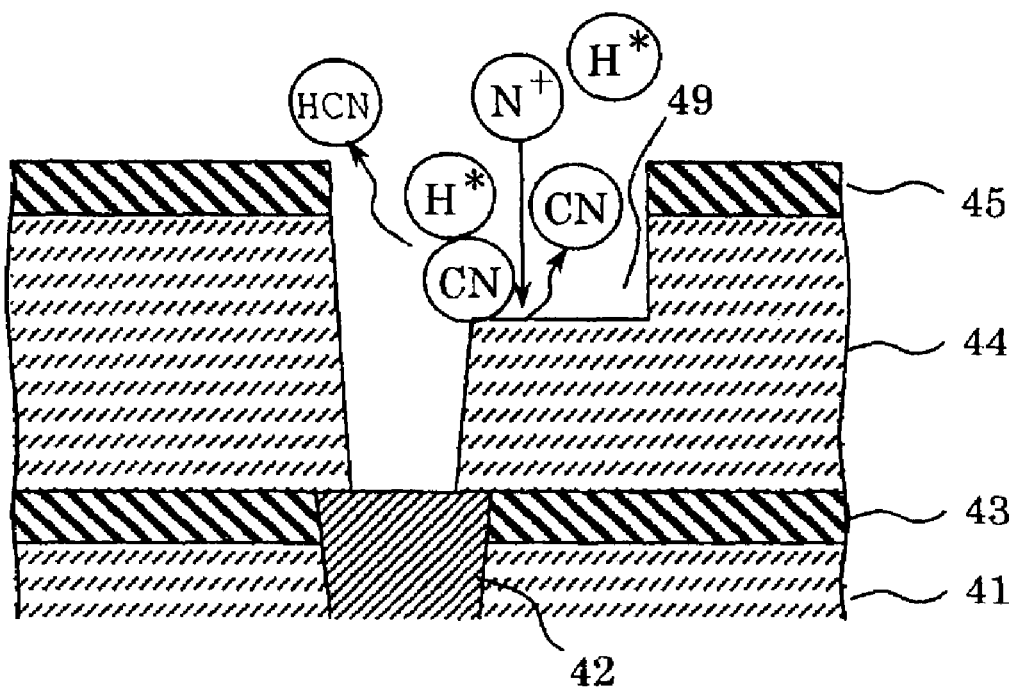
FIG. 7 is a cross sectional view illustrating the shape of cross section of etching which has been subjected to etching in the state of the plasma light emission intensity shown in FIG. 5.

The fact that hydrogen atom (H) is higher than cyan molecule (CN) in light emission intensity means that, in the plasma, the quantity of hydrogen atom (H) (in other words, H radical) is larger than the quantity of cyan molecule (CN). Thus, it is considered that the state of reaction is as shown in FIG. 7. That is, in the plasma, the quantity of H radical is larger than that of N ion as an etchant. Upon incidence of N ion into the etched surface, the N ion reacts with organic insulating film 44 to form cyan molecule CN as a reaction product. The cyan molecule CN which has once left the wafer 2 again enters the wafer 2 and is deposited on the bottom surface of etched part. When H radical originated from the plasma is contacted with the deposited CN molecule, there occurs a reaction to form a more volatile reaction product HCN which vaporizes from the etched surface and is exhausted. Thus, the process of etching progresses regardless of the influence of deposition distribution of reaction product (in this case, cyan molecule CN) in the etched part (deposition distribution: the reaction product is more readily deposited on the central part of trench than in the neighborhood of sidewall), and thereby the sub-trenching can be prevented.

Figure 6:
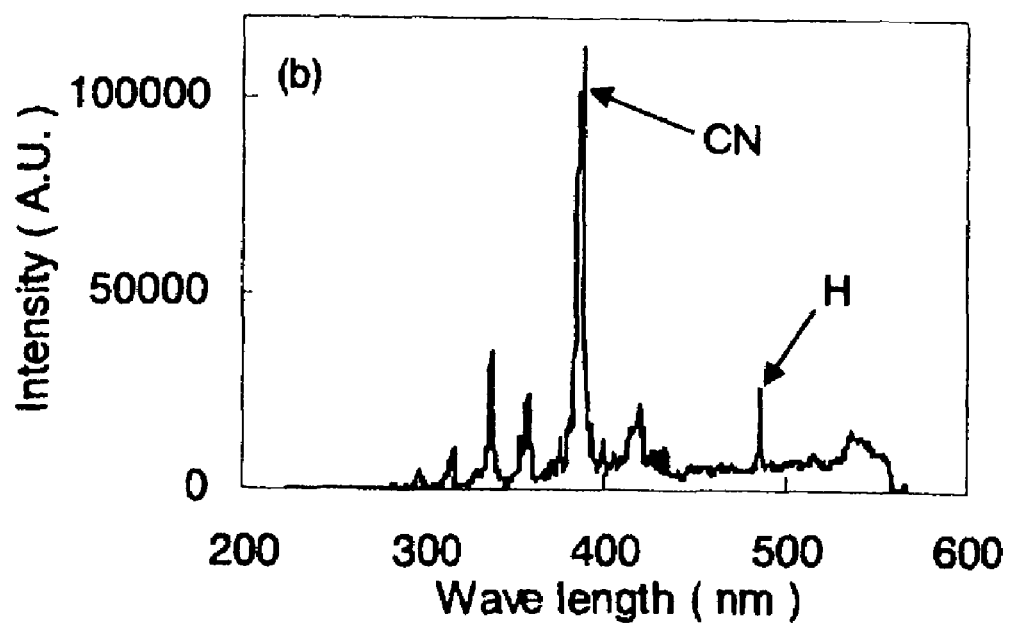
FIG. 6 is a figure illustrating the light emission intensity of a plasma in a subtrench-forming etching process in an interconnect wiring trench processing of an organic insulating film.
Figure 8:
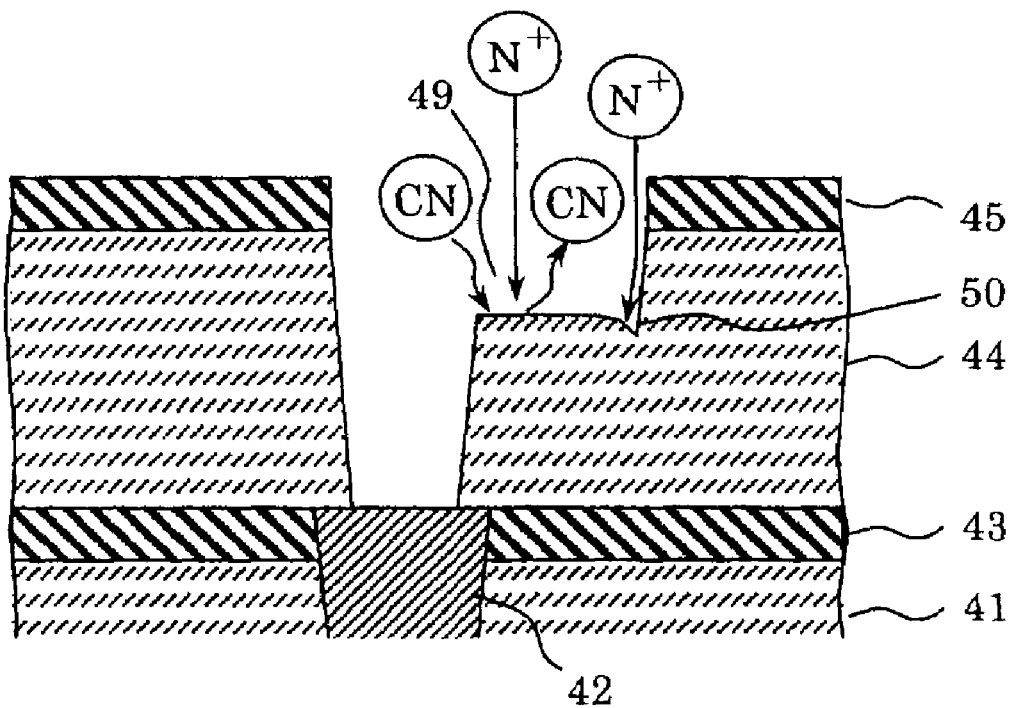
FIG. 8 is a cross sectional view illustrating the shape of cross section of etching which has been subjected to etching in the state of the plasma light emission intensity shown in FIG. 6.

Contrariwise, sub-trenching occurs in the other cases (Case 3, 4 and 5). If the light emission intensities of cyan molecule (CN) and hydrogen atom (H) in the plasma are measured and compared with those under the conditions inducing sub-trenching, it is found that intensity of hydrogen atom (H) is lower than that of cyan molecule (CN) as shown in FIG. 6. The etching conditions in these cases are as follows; $H_2$: 35 sccm, $N_2$: 35 sccm, treating pressure: 3 Pa, high-frequency power for generation of plasma: 1 kW. It is considered that the state of reaction is as shown in FIG. 8 under such conditions. That is, the plasma contains a large quantity of N ion, and a high etch rate can be achieved. At the same time, the quantity of CN is also large, and re-deposition of CN onto the etched surface takes place. Since the reaction product is more readily deposited onto the central part of bottom surface than in the bottom surface near the sidewall of etched surface, the bottom surface near the sidewall is more readily etched to inducing sub-trenching. Further, it is also considered that N ion having a higher incidence energy into wafer is concentrated into the neighborhood of sidewall of the etched part, and thereby sub-trenching occurs.

Figure 9:
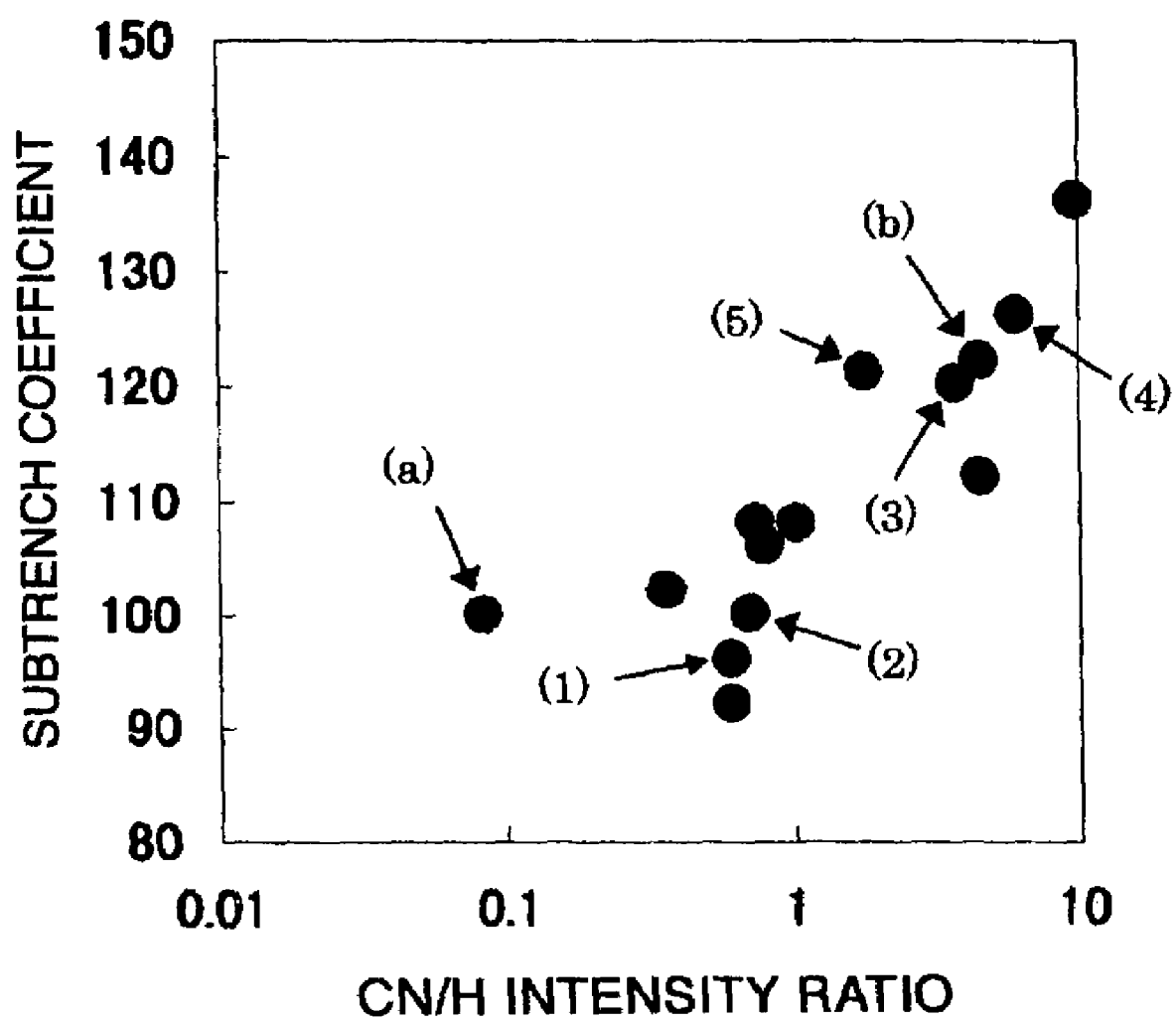
FIG. 9 is a figure illustrating the relation between the light emission intensity ratio CN/H between cyan molecule and hydrogen atom in a plasma and sub-trenching, in an interconnect wiring trench processing of an organic insulating film.

FIG. 9 illustrates the relation between light emission intensity ratio between cyan molecule (CN) and hydrogen atom (H), namely CN/H, and the sub-trenching coefficient. It is understandable from FIG. 9 that the CN/H ratio at which the sub-trenching coefficient becomes 100% or less where no sub-trenching occurs is 1 or less, roughly saying. Additionally saying, the point in the case shown in Table 1 is the point to which case number is attached. The state of light emission intensity shown in FIG. 5 is point (a), and the state of light emission intensity shown in FIG. 6 is pint (b).

Figure 10:
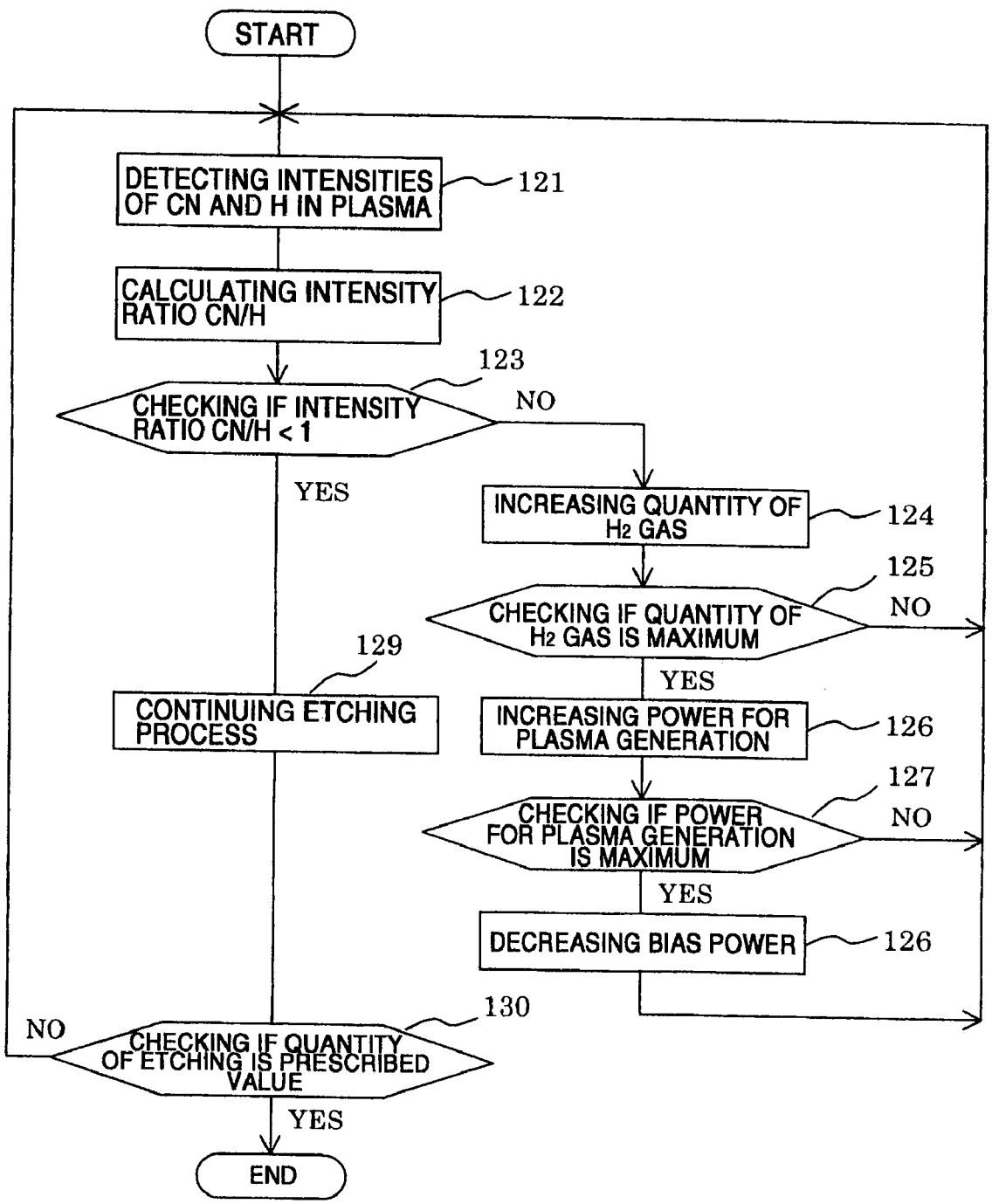
FIG. 10 is a chart illustrating the flow for suppressing the sub-trenching in an interconnect wiring trench processing of an organic insulating film.

Next, the controlling method for preventing the sub-trenching by the use of the controlling apparatus 31 shown in FIG. 1 is explained by referring to FIG. 10.

In the above-mentioned Step 116 of the etching for forming wiring trench in an organic insulating film, the emission spectra from the cyan molecule CN and hydrogen atom H from the plasma are converted to electric signals by means of a photoelectric converter, and the respective intensities are measured (Step 121). From the measured intensities of CN and H, intensity ratio CN/H is calculated (Step 122). Subsequently, whether or not the intensity ratio CN/H is smaller than 1 or less is judged (Step 123). If the judged intensity ratio is 1 or less, the etching is continued without changing the conditions (Step 129). After continuing the etching, whether the desired quantity of etching has been reached or not is judged according to the above-mentioned method of end point detection using film thickness measurement (Step 130). When the desired quantity of etching is not yet reached, the procedure is turned back to Step 121 and the processing is continued. When the quantity of etching has reached the desired value and the end point of etching has been detected, the etching process is completed.

On the other hand, when emission intensity ratio is greater than 1 in Step 123, the flow rate controlling valves are operated to increase the flow rate of hydrogen gas (Step 124). Although it is also allowable to decrease the flow rate of nitrogen gas, such an operation causes a decrease in etch rate. Therefore, it is more desirable to change the flow rate of hydrogen gas. Although not shown in the figure, the controller 31 controls the gas exhaust rate controlling valve 27 so as to give a constant process pressure. Subsequently, whether or not the value of flow rate control has reached the upper limit, or maximum, is judged (Step 125). So far as the value of flow rate control has not reached the maximum value, the procedure is turned back to Step 121, and check of intensity ratio is repeated.

In the case where the value of flow rate control is maximum and it is impossible to increase the quantity of hydrogen gas further, the electric power for plasma generation is increased (Step 126). By taking such a measure, the decomposition of hydrogen molecule in the plasma is enhanced, a larger quantity of H radical is formed, and light emission intensity of H radical is enhanced. Subsequently, whether the output of the high-frequency power from the high-frequency electric source for plasma generation is maximum or not is judged (Step 127). So far as the output of high-frequency power has not yet reached the maximum, the procedure is turned back to Step 121 and the check of intensity ratio is repeated.

On the other hand, in the case where the output of high-frequency power is maximum and the power value cannot be enhanced further, output of the high-frequency power of bias-application to wafer is lowered (Step 128).

As above, the control is carried out by increasing hydrogen gas in the first stage and increasing the power for plasma generation in the second stage. Accordingly, occurrence of sub-trenching is suppressed without lowering the etch rate-caused parameter. Thus, sub-trenching can be prevented while maintaining the prescribed etch rate.

As has been mentioned above, according to the present example, a process pressure lower than 10 Pa is adopted, and the reaction product CN which is apt to be re-deposited at the time of etching is positively converted to highly volatile HCN through reaction with the hydrogen component and then exhausted. Accordingly, the method of the present example has an effect that etching of organic insulating film can be performed while preventing micro-trenching.

Further, according to the present example, in the etching of organic insulating film having a low dielectric constant, trench or hole can be flattened without forming sub-trench, and therefore a trench for electric wiring can be formed on semiconductor LSI chips without using an etch stop layer.

Further, according to the present example, etching process of organic insulating film can be carried out without sub-trenching by using a mixture of nitrogen gas and hydrogen gas as a treating gas under a treating pressure lower than 10 Pa and controlling the light emission intensity ratio between emission spectra of cyan molecule CN and hydrogen atom H in the plasma so as to come to 1 or less.

Further, by increasing and controlling the flow rate of hydrogen gas so that the light emission intensity ratio CN/H comes to 1 or less, the sub-trenching can be suppressed without decreasing the etch rate of organic insulating film.

Further, by increasing and controlling the output of the high-frequency power for plasma generation so that the light emission intensity ratio CN/H comes to 1 or less, the quantity of H radical in plasma can be increased and thereby sub-trenching can be suppressed without lowering the etch rate of organic insulating film.

Further, since a gaseous mixture of nitrogen gas and hydrogen gas is used as the process gas, the gas formulation is simple, and the light emission intensity ratio CN/H can easily be controlled by controlling the flow rate of process gas.

In the present example, a mixture of nitrogen gas and hydrogen gas was used as the process gas for trench-processing of organic insulating film. However, the same effect as above can be obtained also by using a gaseous mixture of ammonia gas and hydrogen gas and making the light emission intensity ratio CN/H in the plasma come to 1 or less.

In the present example, an UHF magnetic field type plasma etching apparatus using an electric source of frequency 450 MHz was used as the high-frequency electric source for plasma generation. However, the same effect as above can also be achieved with an apparatus of other discharge methods such as micro wave ECR, capacitive coupled, inductive coupled, magnetron, etc., so far as the apparatus is capable of etching an organic insulating film at a process pressure lower than 10 Pa, by balancing between cyan molecule and hydrogen atom.

As above, according to this invention, there can be achieved an effect that an organic insulating film can be etched while suppressing the deposition of reaction product onto inside of process chamber and preventing the microtrenching.

It should be further understood by those skilled in the art that the foregoing description has been made on embodiments of the invention and that various changes and modifications may be made in the invention without departing from the spirit of the invention and the scope of the appended claims.

What is claimed is:

1. An etching method for etching a sample including an organic insulating film using plasma, the etching method comprising the steps of:

generating a plasma while providing a mixed gas containing a hydrogen gas and a nitrogen gas or an ammonia gas in an etching process chamber in which the sample is placed;

measuring a light emission spectral intensity ratio of cyan molecule and hydrogen atom in the plasma; and controlling a mixing ratio of the mixed gas to enhance the light emission spectral intensity of hydrogen atom to not less than the light emission spectral intensity of cyan molecule.

2. The etching method according to claim 1, wherein the step of generating the plasma includes controlling a pressure in the etching process chamber to be lower than 10 Pa.

3. The etching method according to claim 1, wherein the mixing ratio of the hydrogen gas to the nitrogen gas or the ammonia gas in the mixed gas is controlled to be not less than 10.

4. The etching method according to claim 1, further comprising controlling a total flux of the mixed gas to be not less than 200 cc/min.

5. The etching method according to claim 1 further comprising controlling an electric power for forming the plasma.

6. The etching method according to claim 1 further comprising controlling output of high-frequency electric power of bias-application to the sample to be etched to enhance the light emission spectral intensity of hydrogen atom to not less than the light emission spectral integrity of cyan molecule.

7. An etching method for etching a sample including an organic insulating film using plasma, the etching method comprising the steps of:

generating a plasma while providing a mixed gas containing a hydrogen gas and a nitrogen gas or an ammonia gas in an etching process chamber in which the sample is placed;

measuring a light emission spectral intensity ratio of cyan molecule and hydrogen atom in the plasma; and controlling a flux of the hydrogen gas of the mixed gas to enhance the light emission spectral intensity of hydrogen atom to not less than the light emission spectral intensity of cyan molecule.

8. The etching method according to claim 7, wherein the step of generating the plasma includes controlling a pressure in the etching process chamber to be lower than 10 Pa.

9. The etching method according to claim 7, wherein the mixing ratio of the hydrogen gas to the nitrogen gas or the ammonia gas in the mixed gas is controlled to be not less than 10.

10. The etching method according to claim 7 further comprising controlling a total flux of the mixed gas to be not less than 200 cc/min.

11. The etching method according to claim 7 further comprising controlling an electric power for forming the plasma.

12. The etching method according to claim 7 further comprising controlling output of high-frequency electric power of bias-application to the sample to be etched to enhance the light emission spectral intensity of hydrogen atom to not less than the light emission spectral integrity of cyan molecule.

* * * * *